United States Patent [19]

Seo

[11] Patent Number: 5,119,333
[45] Date of Patent: Jun. 2, 1992

[54] SAM DATA ACCESSING CIRCUIT HAVING LOW OPERATING CURRENT

[75] Inventor: Seungmo Seo, Seoul, Rep. of Korea

[73] Assignee: Samsung Electronics Co., Ltd., Rep. of Korea

[21] Appl. No.: 622,477

[22] Filed: Dec. 5, 1990

[30] Foreign Application Priority Data

Jul. 9, 1990 [KR] Rep. of Korea ............... 90-10364

[51] Int. Cl.⁵ .......................................... G11C 13/00
[52] U.S. Cl. ............................ 365/189.05; 365/230.08
[58] Field of Search ................. 365/189.05, 189.01, 365/230.01, 230.08

[56] References Cited

U.S. PATENT DOCUMENTS 4,977,542 12/1990 Matsuda et al. .................... 365/207

Primary Examiner—Terrell W. Fears
Attorney, Agent, or Firm—Cushman, Darby & Cushman

[57] ABSTRACT

A SAM data accessing circuit and a method thereof in which, at the falling edge of a serial counting clock signal SC occurring at one and half cycles before data output cycles, the data is sensed from a SAM port memory. The sensed data is then stored in a first section of a two-stage buffer. At the falling edge of the serial counting clock signal SC occurring at half-cycles before data output cycles, the data stored in the first stage of the buffer is transferred to a second stage thereof. At the rising edge of the serial counting clock signal SC, the data stored in the second section of the buffer is outputted. This sensing/outputting sequence reduces peak currents consumed by the I/O circuits.

5 Claims, 7 Drawing Sheets

SAM DATA ACCESSING CIRCUIT HAVING LOW OPERATING CURRENT

BACKGROUND OF THE INVENTION

The present invention relates to a Serial-Accessed Memory (hereinafter referred to as SAM) data accessing circuit involving a low operating current and a method thereof, and particularly to a SAM data accessing circuit and a method thereof, in which the peak current can be reduced by separating the data sensing time and the data outputting time from each other. Thus, the operating current is reduced by preventing the consumption of the unnecessary current during the serial accessing.

Generally, in a dual port DRAM, a first port has the same structure as that of the normal DRAM, and a second port consists of a serial data register and a circuit for inputting/outputting the data in a serial manner.

Unlike the normal DRAM, such a dual port DRAM is capable of outputting the data in an independent manner, and the data accessing is carried out through the dual port, with the result that the power consumption becomes seriously high compared with the normal DRAM.

Therefore, if the dual port DRAM is to avoid a serious problem excessive with the power consumption compared with the normal DRAM, then it is necessary that the data accessing be carried out with a minimum power consumption.

SUMMARY OF THE INVENTION

The object of the present invention is to provide a SAM data accessing circuit and a method thereof, in which the power consumption is reduced by separating the data sensing time and the data outputting time.

In achieving the above object, the method of the present invention is characterized in that an address is generated in accordance with a serial counting clock; the column address is decoded to select the data; the data sensing operation is subjected to a modelling until the selected data is supplied through a data input/output line to an input/output sense amplifier; the data sensing operation and the data outputting operation are separated in accordance with the time of the modelling; and then, the data is accessed from the SAM.

Further, in achieving the above object, the SAM data accessing circuit of the present invention comprises: a serial counter for outputting a serial address by counting a serial counting clock signal; a column decoder for selecting an input/output gate; an input/output sense amplifier for amplifying the data supplied through the input/output gate and an input/output line; and a data outputting buffer for supplying to an input/output path the data amplified through the sense amplifier.

The circuit of the present invention is further characterized in that it comprises: a column pre-decoder for outputting a column decoder selecting signal after receipt of a serial address outputted from the serial counter;

a serial decoding disabling circuit for outputting a disabling signal to the column predecoder upon receipt of a track detecting signal from a track circuit, and for outputting an enabling signal to the column predecoder after receipt of a serial counting clock signal; and a track circuit for predecoding the output of the serial counter after receipt of a serial counting clock signal, for selecting an input/output gate upon supplying of an output signal of the column predecoder to a column decoder, for modelling the time until the data of SAM is supplied through the input/output line to the sense amplifier, and for outputting track signals to the input/output sense amplifier, to the serial decoding disabling circuit and to the column predecoder.

BRIEF DESCRIPTION OF THE DRAWINGS

The above object and other advantages of the present invention will become more apparent by studying the preferred embodiment of the present invention with reference to the attached drawings in which.

DESCRIPTION OF THE PREFERRED EMBODIMENT

Figure 1:
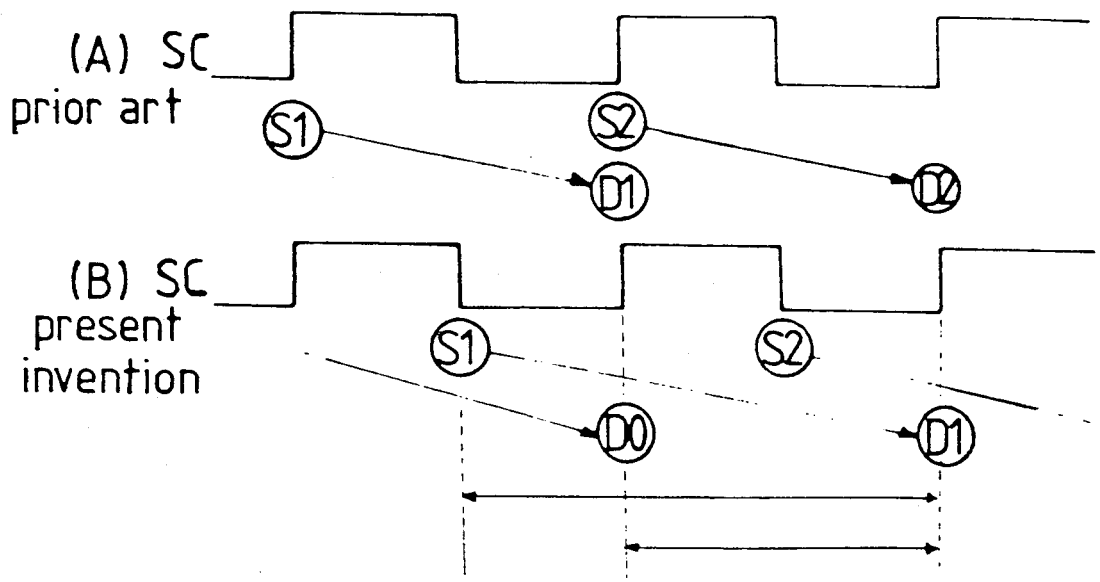
FIG. 1A is a timing chart showing the outputting of the data after carrying out a serial accessing the data of the SAM according to a conventional technique.
FIG. 1B is a timing chart showing the outputting of the data after carrying out a serial accessing of the SAM data in an improved manner according to the present invention.

FIG. 1 illustrates timing charts showing the data sensing time and the data outputting time in a dual port DRAM.

Figure 2:
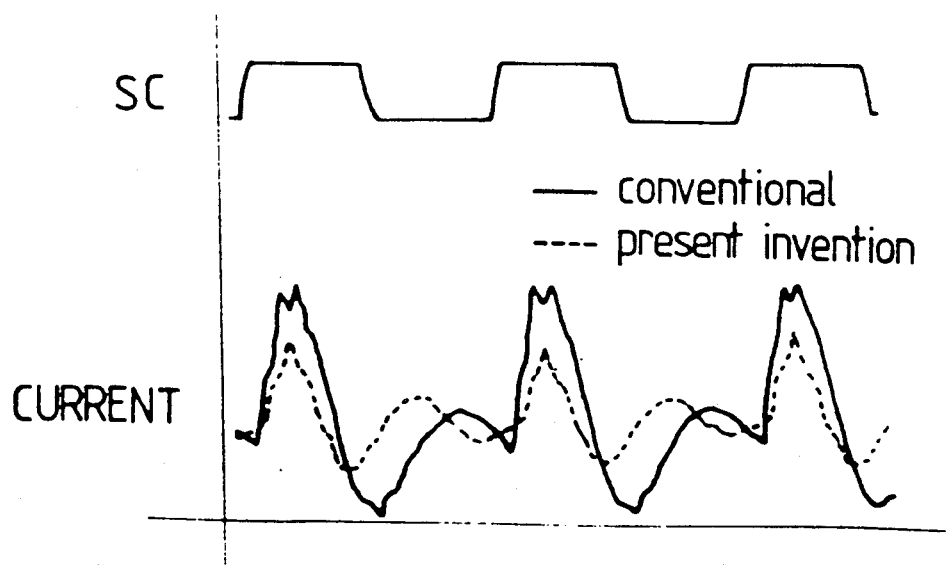
FIG. 2 illustrates the current values measured during the SAM data accessing and outputting according to the conventional technique and according to the present invention in a comparative form.

Conventionally, as shown in FIG. 1A, the data is sensed and at the same time outputted at the rising edge of a serial counting clock signal SC, and therefore, at the portion where the data sensing operation and the data outputting operation are overlapped, i.e., at the rising edge of the clock signal SC, the peak currents are overlapped as shown in FIG. 2 by the solid line, thereby problematically increasing the peak current.

The present invention reduces the peak currents caused by the simultaneous occurrence of the sensing operation and the outputting operation. As shown in FIG. 1B, a data S1 to be outputted is accessed and sense-amplified in advance at 3/2 cycles before the outputting, i.e., at the falling edge of the clock SC, and then, the data is stored into a first section of a two-stage buffer by a pipeline method.

Thereafter, at the rising edge of the clock SC, the data DO which is stored in a second section of the pipeline buffer after being sensed before one and half cycles is outputted.

Then, at the falling edge of the clock SC, a new data S2 is sensed, amplified and supplied to the first section of the pipeline type buffer, and the data S1 stored in the first section is transferred to the second section, while, upon arriving of another rising edge, the data S1 which has been stored in the second section is outputted as a data D1.

Thus, according to the present invention, the sensing time and the outputting time for the serial data are different from each other, and therefore, as shown by dotted lines in FIG. 2, the peak currents are dispersed, thereby obtaining a power consumption decreasing effect.

As described above, the present invention is intended to decrease the power consumption by separating the data sensing operation and the data outputting operation, and the present invention will be described in a further detail referring to FIGS. 3 and 4.

Figure 3:
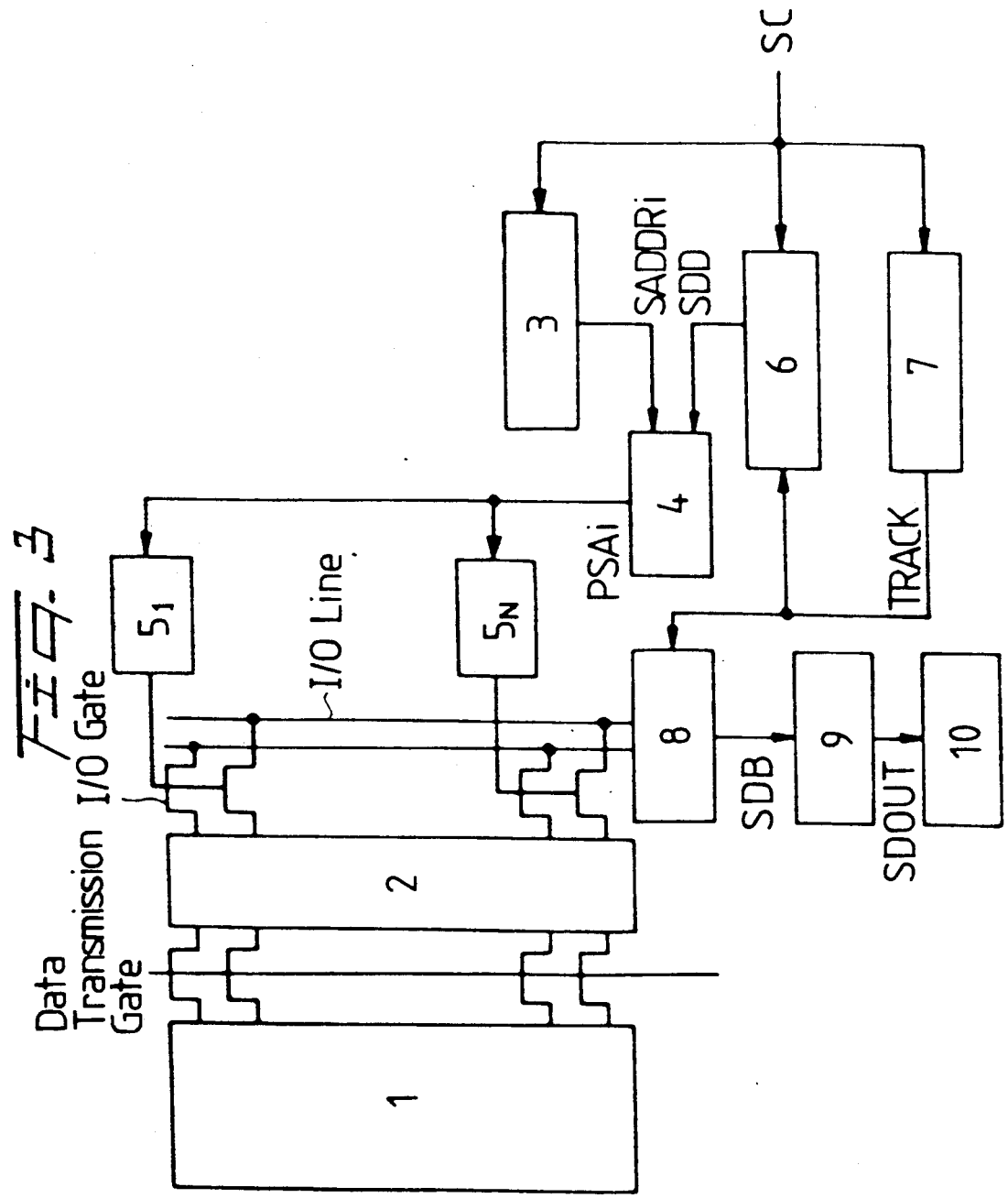
FIG. 3 is a block diagram of the SAM data accessing circuit of the present invention involving low operating current.

FIG. 3 illustrates a circuit for serially accessing the data of the dual port memory according to the present invention. Here, reference code 1 indicates a RAM port memory array, and 2 indicates a SAM port array.

The SAM data accessing circuit according to the present invention comprises: a serial counter 3 for outputting a serial address SADDRi after receipt of a serial counting clock signal SC;

- a column predecoder 4 for outputting a serial address PSAi to column decoders $5_1$-$5_N$ after decoding the serial address SADDRi supplied from the serial counter 3;
- column decoders $5_1$-$5_N$ for outputting signals for gating an input/output gate(to be called hereinafter I/O gate) after receipt of an address PSAi from the column predecoder 4;
- a tracking circuit 7 for outputting track signals TRACK to an I/O sense-amplifier 8 and to a serial decoding disabling circuit 6, by modelling the time until the column predecoder 4 predecodes the output of the serial counter SC starting from the falling edge of the serial counting clock signal SC, until the column decoders $5_1$-$5_N$ receive the output signals of the column predecoder 4 so as for an I/O gate to be selected, and until the data stored in the SAM port memory 2 is supplied from the RAM port memory array 1 through an I/O line to an I/O sense-amplifier 8;
- a serial decoding disabling circuit 6 for outputting a serial decoding disabling signal to the column predecoder 4 after receipt of a serial counting clock signal SC, and for outputting a serial decoding disabling signal SDD to the column predecoder 4 after receipt of a tracking signal TRACK from the tracking circuit;
- an I/O sense-amplifier 8 for amplifying the data supplied from the SAM port array 2 through an I/O gate and an I/O line selected by the column decoder $5_1$-$5_N$; and
- a data outputting buffer 9 for outputting to an input/output buffer 10 the data amplified by the sense-amplifier.

Here, if the output data of a row selected from the RAM port memory array 1 consists of N bits, then the number of the required column lines is N.

The operation of accessing of the data according to the present invention will be described referring to the timing charts of FIG. 4. If the data of the RAM port memory array is to be serially accessed, then the data of one row of the RAM port memory array must be sensed, and the sensed data must be transferred through a transfer gate to the SAM port memory array 2 in advance.

If a serial counting clock signal SC is supplied from an external controller to the serial counter 3, then the serial counter 3 sequentially generates serial address signals in order to cause sequential generation of signals for the selecting one of column lines in accordance with the clock signal SC.

Figure 4:
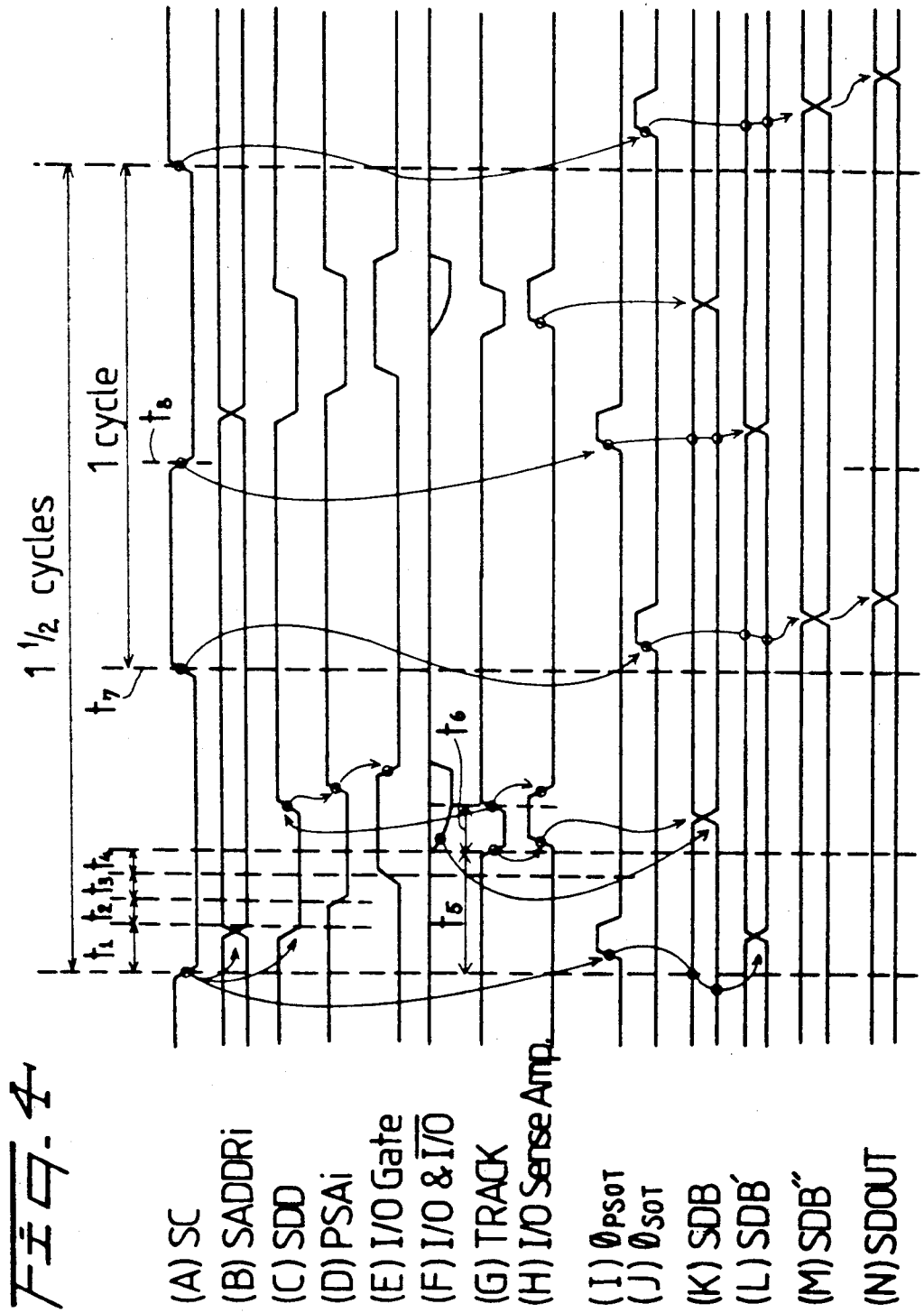
FIG. 4 is a timing chart showing the accessing and outputting of the SAM data involving a low operating current according to the present invention.

As shown in FIG. 4, when the signal SC is at the falling edge, the serial counter 3 is activated after a time interval $t_1$, and supplies a serial address signal SADDRi of FIG. 4B to the column predecoder 4. At the same time, the serial decoding disabling circuit 6 outputs a serial decoding disabling signal SDD (refer to the timing chart of FIG. 4C) to the column predecoder 4, and therefore, the column predecoder 4 is enabled in order to decode the serial address.

Then, the column predecoder 4 decodes the address signal SADDRi in order to supply a predecoded serial address signal PSAi to the column decoders $5_1$-$5_N$ after a time interval $t_2$ (refer to the timing chart of FIG. 4D).

The column decoders $5_1$-$5_N$ generate signals for selecting an I/O gate after receipt of the serial address signal PSAi which is predecoded by the column predecoder 4.

If an I/O gate is gated by the output signals of the column decoders $5_1$-$5_N$, then the data which has been transferred from the RAM port memory array 1 to the SAM port memory array 2 through a data transmission gate is outputted through the I/O line.

Meanwhile, the tracking circuit 7 establishes the time interval $t_5$ (i.e., $t_5 = t_1 + t_2 + t_3 + t_4$) which is required for the operations during the period when the data transferred to the SAM port memory array 2 is supplied through an I/O line to the I/O sense-amplifier 8. Specifically, this tracking circuit 7 is for: establishing the time interval $t_1$ which is required for outputting a serial address SADDRi by the serial counter 3 after receipt of a serial counting clock signal SC; establishing the time interval $t_2$ which is required for outputting a predecoded serial address signal PSAi after decoding the serial address SADDRi by the column predecoder 4; establishing the time interval $t_3$ (refer to the timing chart of FIG. 4E) which is required for gating an I/O line after receipt of the predecoded serial address signal PSAi by the column decoders $5_1$-$5_N$; and defining the time $t_4$ (refer to the timing chart of FIG. 4F) which is required for supplying the data through the I/O line to the sense-amplifier 8 after the data is dispatched through the selected I/O gate from the SAM port memory array 2.

Thus, after the time intervals $t_5 = t_1 + t_2 + t_3 + t_4$ are tracked by the tracking circuit 7, if a tracking signal TRACK of FIG. 4G is supplied to the I/O sense-amplifier 8 to activate it, then the I/O sense-amplifier 8 senses and amplifies the data supplied through the I/O line, and supplies a serial data to the data output buffer 9.

Meanwhile, the tracking signal is also supplied to the serial decoding disabling circuit 6, and therefore, after data which is amplified by the I/O sense-amplifier 8 is supplied to the data output buffer 9 as shown in FIG. 4H, the serial decoding disabling circuit 6 outputs a high state disabling signal SDD (FIG. 4C) to the column predecoder 4 after a time interval $t_6$. Therefore, as shown in FIG. 4D, the column predecoder 4 is deactivated because of the serial address signal shifted to a high state, and the sensing operation as described above is no longer carried out.

That is, until the next falling edge of the serial counting clock has arrived, the operation of sensing the data of the SAM port memory array 2 is stopped.

After the termination of the data sensing operation as described above, if the rising edge of the clock signal SC arrives, the data which has been sensed by the above mentioned manner and stored in the data output buffer 9 before one and half cycles from the time $t_7$ in FIG. 4A is outputted through the I/O path 10. Of course, the data sensed shall be outputted after one and half cycles from the start of the time interval $t_1$ in FIG. 4, and this can be illustrated as FIG. 1B.

A detailed description about the data output with reference to a detailed circuit illustration will be provided afterward.

Thus, it became possible to separate the data sensing time and the data outputting time in accessing to the data of the SAM port array.

Meanwhile, another method of decreasing the current according to the present invention will be described referring to FIG. 4F.

When data is supplied through the I/O line to the I/O sense amplifier, and if the I/O line is developed completely to the state of the power source voltage Vcc, then the developing time is extended, and the current flows through the register (not shown) of the SAM port during the extended time period.

However, when inhibiting consumption current according to the present invention, the I/O line is open for a time period to permit the I/O sense-amplifier 8 to transmit I/O signals, as shown in FIG. 4F. The remaining time is used for precharging.

To describe it more specifically, in FIG. 3, when the I/O line is precharged, then, in order to inhibit DC current dissipation, the decoder circuits 4 and decoders $5_1$-$5_N$ are disabled by the disabling clock generated by the disabling circuit 6, described above. Therefore, the I/O line and the decoding circuits are operated during the period between the falling edge of the serial counting signal SC and the termination of the sensing. During the rest of the period, all the serial accessing circuits except the data output buffer 9 are disabled by the disabling circuit 6.

Figure 5:
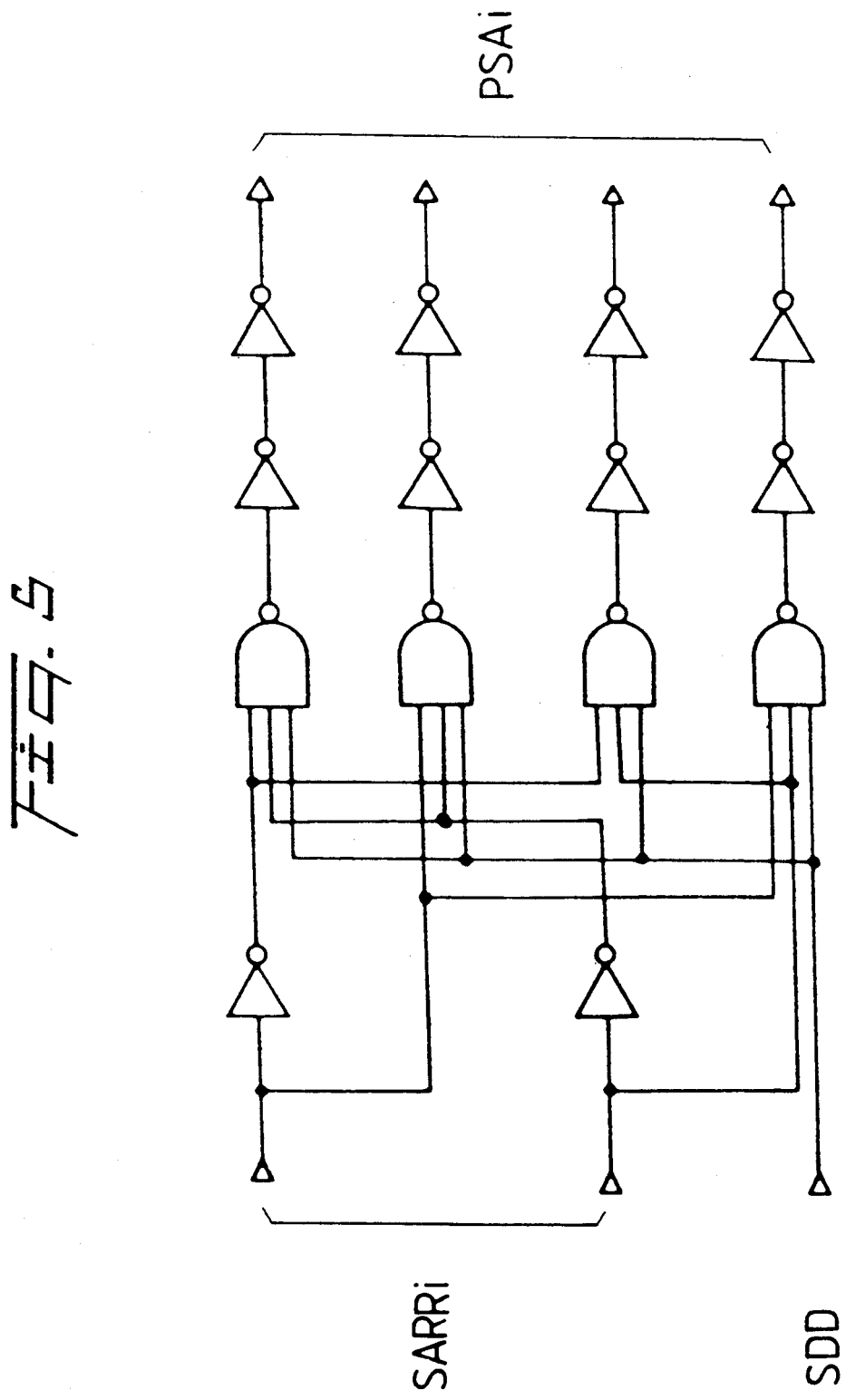
FIGS. 5 to 7 are detailed circuit illustrations of the tracking circuit, the serial decoding disabling circuit and the column predecoder of FIG. 3.

FIG. 5 illustrates in detail a circuit for the column predecoder 4 of FIG. 3. In this drawing, when a serial decoding disenabling signal SDD of a low state is supplied from the serial decoding disenabling circuit 6, then the column predecoding circuit 4 is enabled to decode the serial address signal SADDRi supplied by the serial counter 3, and to output a column serial address signal PSAi. On the other hand, if a serial decoding disenabling signal of a high state is supplied, then the column predecoder 4 is disenabled, so that the operation of the column predecoder 4 should no longer be performed.

Figure 6:
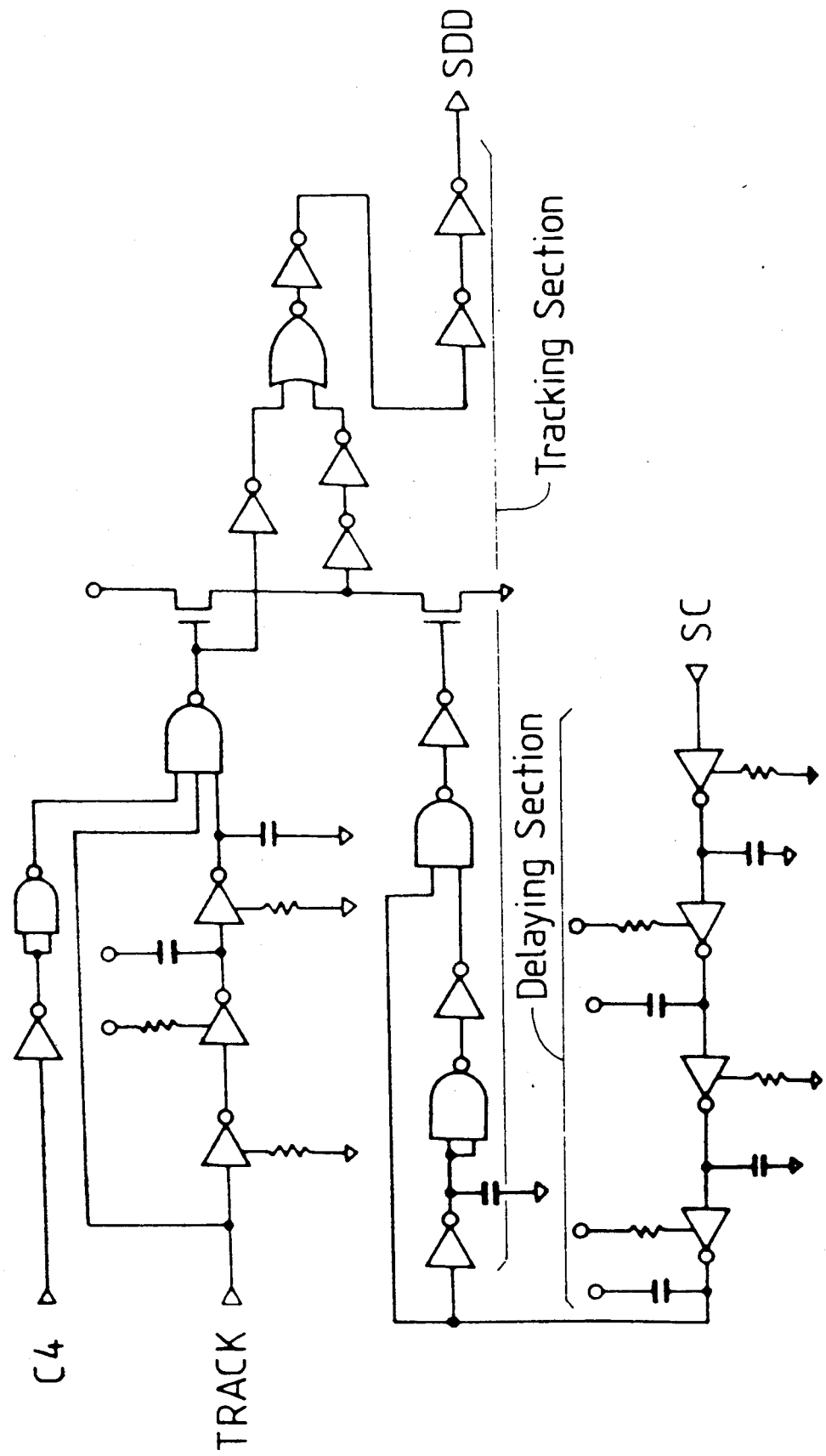

FIG. 6 illustrates in detail a serial decoding disenabling circuit 6 which consists of: a section for delaying the serial counting clock signal SC until a serial address signal SADDRi is outputted after the serial counting clock signal SC is supplied; and a section for defining the time until a tracking signal TRACK is inputted from the tracking circuit after the outputting of a serial address ADDRi, and until the data sensing operation is completed.

The signal C4 is a control signal supplied from the external, and this signal is maintained at a low state during the serial data accessing operation.

Figure 7:
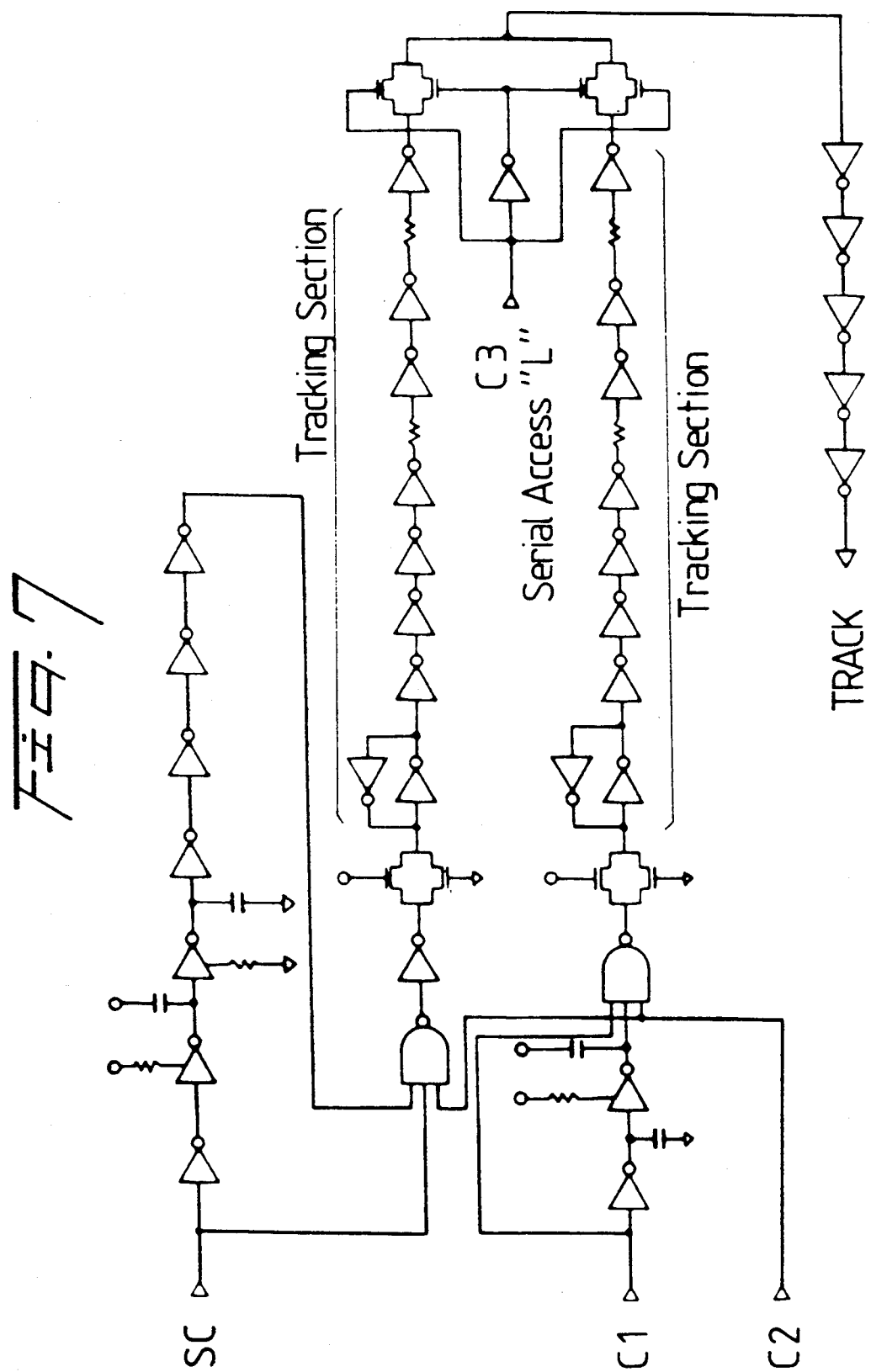

FIG. 7 illustrates in detail the tracking circuit 7, and the layout of this circuit is constituted in the same way as the layout of the signal path corresponding to the segment between the inputting of a serial counting clock signal SC and the supplying of the data to the I/O sense-amplifier 8 after the sensing of the data from the SAM port memory array 2.

Therefore, the tracking circuit 7 establishes the time until the sensed data is supplied to the I/O sense-amplifier 8 after the inputting of the serial counting clock signal SC thereto. Then the tracking circuit 7 outputs a tracking signal TRACK for controlling the I/O sense-amplifier 8 at the time when the data is supplied to the I/O sense-amplifier 8.

As shown in FIG. 4H, the I/O sense-amplifier 8 performs the amplifying operation only until the data sensed by the tracking signal TRACK of the tracking circuit 7 is supplied. After the completion of the amplifying operation of the I/O sense-amplifier 8, the serial decoding disenabling circuit 6 outputs a serial decoding disenabling signal SDD in accordance with the tracking signal, and thereupon, the column predecoding operation is stopped.

A signal C1 is used for setting the serial accessing mode or the data transmission operating mode, and this signal is maintained at a high state when the data is serially accessed as is the case of the present invention. A signal C2 is a control signal supplied from the external, and this signal is maintained at a high state during the serial accessing to the data.

A signal C3 is disposed at the rear of the tracking circuit, and drives the transmission gate so that a tracking signal to be outputted in relation with the serial data accessing operation, after the signal C3, is shifted to a low state during the serial accessing of the data of the dual port memory. On the other hand, during the data transmission mode, the signal C3 drives the transmission gate so that the transmission gate should output a tracking signal in relation with the data transmission operation.

Now their operation will be described in detail referring to FIGS. 8 and 4, FIG. 8 a detailed circuit illustration of the I/O sense amplifier 8 and the output buffer 9, as described above, and FIG. 4 being an illustration of timing charts for the circuit of FIG. 8.

As shown by the detailed circuital illustration of FIG. 5, the output signals PSAi of the column predecoder 4 are supplied respectively to the column decoders $5_1$-$5_N$, so that the corresponding column decoder should activate the I/O gate. Thus, the data are supplied from the SAM port memory array 2 to the I/O sense amplifier 8 (to be described below) in the form of I/O and I/O signals.

Figure 8:
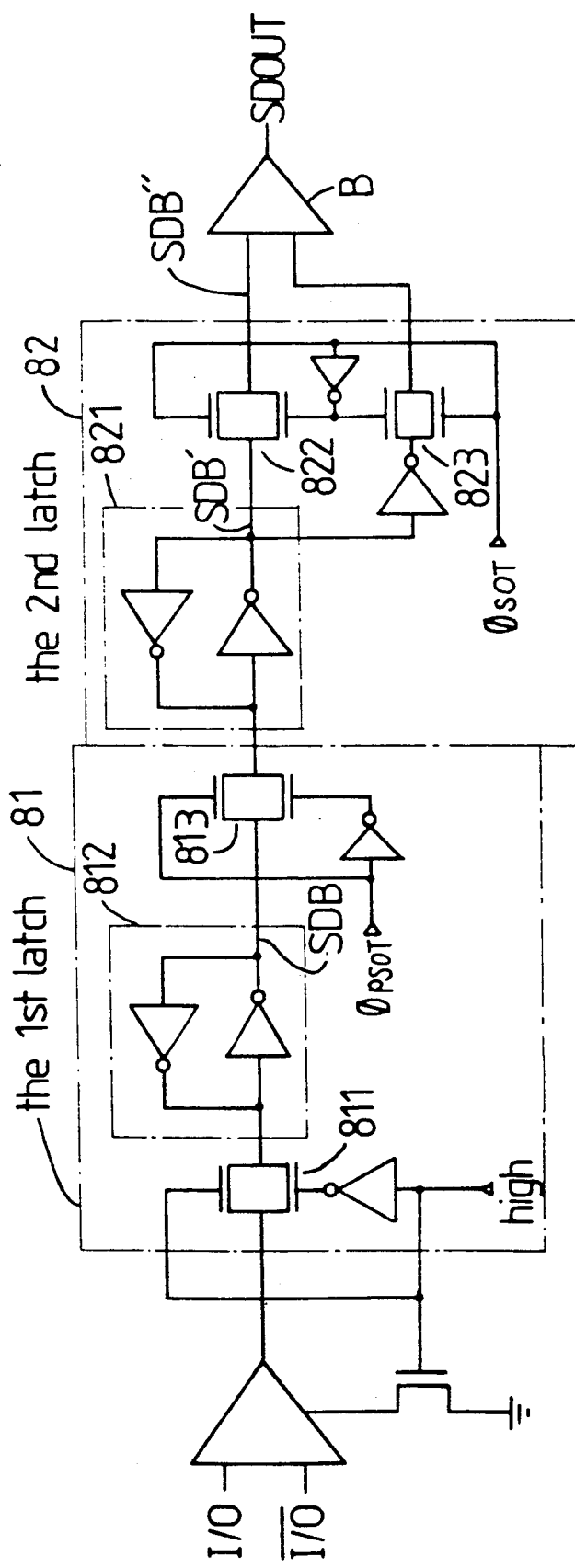
FIG. 8 is a detailed circuit illustration for an I/O sense-amplifier and an output buffer.

As shown in FIG. 8, the I/O sense amplifier 8 and the corresponding output buffer 9 consist of a first latch and a second latch which are connected each other.

As mentioned in the beginning of this specification, the data outputting is carried out in such a manner that: at the falling edge of the SC clock, the data to be outputted is accessed and sense-amplified; and the data is stored into a two-stage buffer (to be outputted based on a pipeline method), i.e., into the first stage (the first latch) 81 among the first and second latches 81, 82. Thereafter, at the rising edge of the SC clock, there is outputted another data which has been sensed before one and half cycles, and has been stored in the second stage of the pipeline buffer, i.e., the second latch 82.

Then, at the falling edge of the SC clock, further data is sensed and amplified, and is supplied to the first latch 81, while the data which has been stored in the first latch 81 is transferred to the second latch 82. Thereafter, at the rising edge, the data which has been stored in the second latch 82 is outputted.

The first latch 81 includes a first transmitting gate 811, a first buffer 812 (consisting of two inverters), and a second transmitting gate 813, all of them being sequentially interconnected, while the second transmitting gate receives a signal $\phi_{PSOT}$ as a control signal from the outside.

Meanwhile, the second latch 82 includes: a second buffer 821 consisting of two inverters; and third and fourth transmitting gates 822, 823 to which the non-inverted output and inverted output of the buffer are respectively supplied. The third and fourth transmitting gates 822, 823 receive signals $\phi_{SOT}$ from the outside as the control signals.

Referring to FIG. 4, at the falling edge of the SC clock, i.e., at the start of time interval $t_1$, a high state signal $\phi_{PSOT}$ (FIG. 4I) as a control signal is supplied to the first latch of the I/O sense amplifier.

Then, at the falling edge of the SC clock, a high signal is inputted as a control signal for the first transmitting gate 811 of the first latch 81 (the timing chart of FIG. 4H), while the I/O sense amplifier 8 keeps the inputted data, i.e., the data sensed by the first latch 81. At the rising edge of the SC clock (at the time $t_7$ of FIG. 4), the signals $\phi_{PSOT}\phi_{SOT}$ and come low and high respectively, and therefore, the data which has been stored in the second latch, i.e., the data SDB' which has been existing since one and half cycles before the time $t_7$, is outputted (SPOUT) through the buffer B in the form of a data SDB" transformed from the data SDB', in accordance with the operations of the third and fourth transmitting gates. The signal $\phi_{PSOT}$ is currently in a low state, and therefore, the data which is obtained at the sensing step is not transferred to the second latch 82, but is kept in the first latch 81.

FIG. 4 illustrates the process of outputting the data to the output path 10 at the rising edge of the SC clock and at the time $t_7$.

Then, at the time $t_8$, a new data sensing is carried out, and in this state, the data existing at one and half cycles before the time $t_7$ has already been outputted. In this state, when the signal $\phi_{PSOT}$ is shifted to a high state, the data which is sensed at one and half cycles before the time $t_8$ is transferred to the second latch 82 in the form of SDB', while the data which is newly sensed is kept in the first latch 81 in the form of SDB.

Then, at the rising edge of the SC clock after one and half cycles from the start of the time interval $t_1$, the data which is sensed after the start of the time interval $t_1$ is outputted.

According to the present invention as described above, the time of sensing the data by accessing the data of the SAM and the time of outputting the data to the outside are separated from each other, thereby reducing the peak current. Further, a tracking circuit for establishing the data sensing operation is used in order to drive the I/O sense-amplifier and the column predecoder only during the required time, so that the consumption of the operating current is kept to a minimum.

What is claimed is:

1. A SAM data accessing method for lowering the operating current when accessing data wherein the data is supplied from a RAM port memory array 1 through a transmission gate to a SAM port memory array 2 for storage therein, said method comprising the steps of:
   sensing said data at the falling edge of a serial clock pulse at one and one-half cycles before outputting said data, and storing said sensed data in a first section of a two-stage pipeline buffer;
   transferring the data stored in said first section to a second section of the buffer at the falling edge of the serial clock pulse at half cycles before outputting said data; and
   outputting said data from the second section of said buffer at the rising edge of the serial clock pulse.

2. The SAM data accessing method as claimed in claim 1, wherein the data sensing operation further comprises the steps of:
   generating a serial address signal SADDRi in accordance with said serial clock pulse;
   outputting a column predecoded address signal PSRi after decoding the serial address signal SADDRi;
   selecting the data from said SAM port memory array 2 after decoding the column address PSAi and after gating an input/output gate;
   developing a tracking signal according to the period of generation of the serial address signal SADDRi; and
   amplifying the data sensed in accordance with the tracking signal.

3. The SAM data accessing method as claimed in claim 1, further comprising the steps wherein, when the data is sensed from said SAM is supplied through an input/output line to an input/output sense-amplifier, said input/output line is open only during a period which is sufficient for activating said input/output line be said sense amplifier; and during the remaining period, precharging said input/output line and disabling the decoding operation for gating said input/output line, thereby inhibiting the current consumption.

4. A SAM data accessing circuit having a low operating current, comprising: a serial counter 3 for outputting a serial address by counting serial counting clock signals; column decoders $5_1-5_N$ for selecting an input/output gate; an input/output sense-amplifier 8 for amplifying the data supplied through said input/output gate and an input/output line; and a data outputting buffer for supplying to an input/output path 10 the data amplified by said input/output sense-amplifier 8, characterized in that said SAM data accessing circuit further comprises: a column predecoder 4 for outputting a column decoder selecting signal after receipt of a serial address SADDRi from said serial counter 3;
   a serial decoding disabling circuit 6 for outputting an enabling signal to said column predecoder 4 after receipt of a serial counting clock signal SC, and for outputting a disabling signal SDD to said column predecoder 4 after receipt of a tracking signal TRACK from a tracking circuit 7; and
   a tracking circuit 7 for outputting a tracking signal TRACK after receipt of a serial counting clock signal SC in order to control said input/output sense-amplifier 8 by forming a layout in the same form as that of the layout of the signal path between the inputting of a serial counting clock signal SC and the supplying of the data from a SAM port memory array 2 to said input/output sense-amplifier 8.

5. The SAM data accessing circuit as claimed in claim 4, wherein said tracking circuit 7 predecodes the output of said serial counter 3 after receipt of a serial counting clock signal SC; said tracking circuit 7 performs a modelling of the time until the SAM data is supplied through an input/output line to said input/output sense-amplifier after said column decoders $5_1-5_N$ select an input/output gate upon receipt of the output signal of said column predecoder 4; and said tracking circuit 7 also outputs a tracking signal TRACK to both said serial decoding disabling circuit 6 and to said column predecoder 4 when the sensed data is supplied to said input/output sense-amplifier 8.

* * * * *